(12) United States Patent
Pratlong et al.

(10) Patent No.: US 7,126,860 B2
(45) Date of Patent: Oct. 24, 2006

(54) READ-ACCESSIBLE COLUMN LATCH FOR NON-VOLATILE MEMORIES

(75) Inventors: Jerome Pratlong, Aix-en-Provence (FR); Marc Merandat, Venelles (FR); Stephane Ricard, Marseille (FR); Sylvie B. Vergnes, Trets (FR); Laureline Bour, Pourrieres (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/028,852

(22) Filed: Jan. 3, 2005

(65) Prior Publication Data
US 2006/0077715 A1 Apr. 13, 2006

(30) Foreign Application Priority Data
Oct. 7, 2004 (FR) .................................. 04 10586

(51) Int. Cl.
*G11C 7/00* (2006.01)
(52) U.S. Cl. .............................. 365/189.05; 365/230.08
(58) Field of Classification Search ..................... None
See application file for complete search history.

(56) References Cited

U.S. PATENT DOCUMENTS

| | | | |
|---|---|---|---|
| 4,616,339 A | 10/1986 | Cuppens et al. | 365/185 |
| 4,953,129 A | 8/1990 | Kobayashi et al. | 365/203 |
| 5,065,148 A * | 11/1991 | Yee-Kwong | 345/87 |
| 5,414,380 A * | 5/1995 | Floyd et al. | 327/198 |
| 5,521,864 A | 5/1996 | Kobayashi et al. | 365/185.22 |
| 6,041,221 A | 3/2000 | Caravella et al. | 455/186.1 |
| 6,188,610 B1 | 2/2001 | Kakizoe et al. | 365/185.22 |
| 2003/0117850 A1 | 6/2003 | Masaru Yano | 365/185.17 |

* cited by examiner

*Primary Examiner*—Thong Q. Le
(74) *Attorney, Agent, or Firm*—Schneck & Schneck; Thomas Schneck; Mark Protsik

(57) ABSTRACT

Program column latch circuitry of nonvolatile memory is provided with read-back capability to verify that data bits have been correctly loaded into the latch circuits and written to the memory cells. The interface between the low voltage latches and the external input and output data paths is provided with opposite-facing tri-state buffers that allow latched data to be read out for comparison and verification. Writing of latched data to memory cells can be verified by the read-back without needing any external RAM.

15 Claims, 4 Drawing Sheets

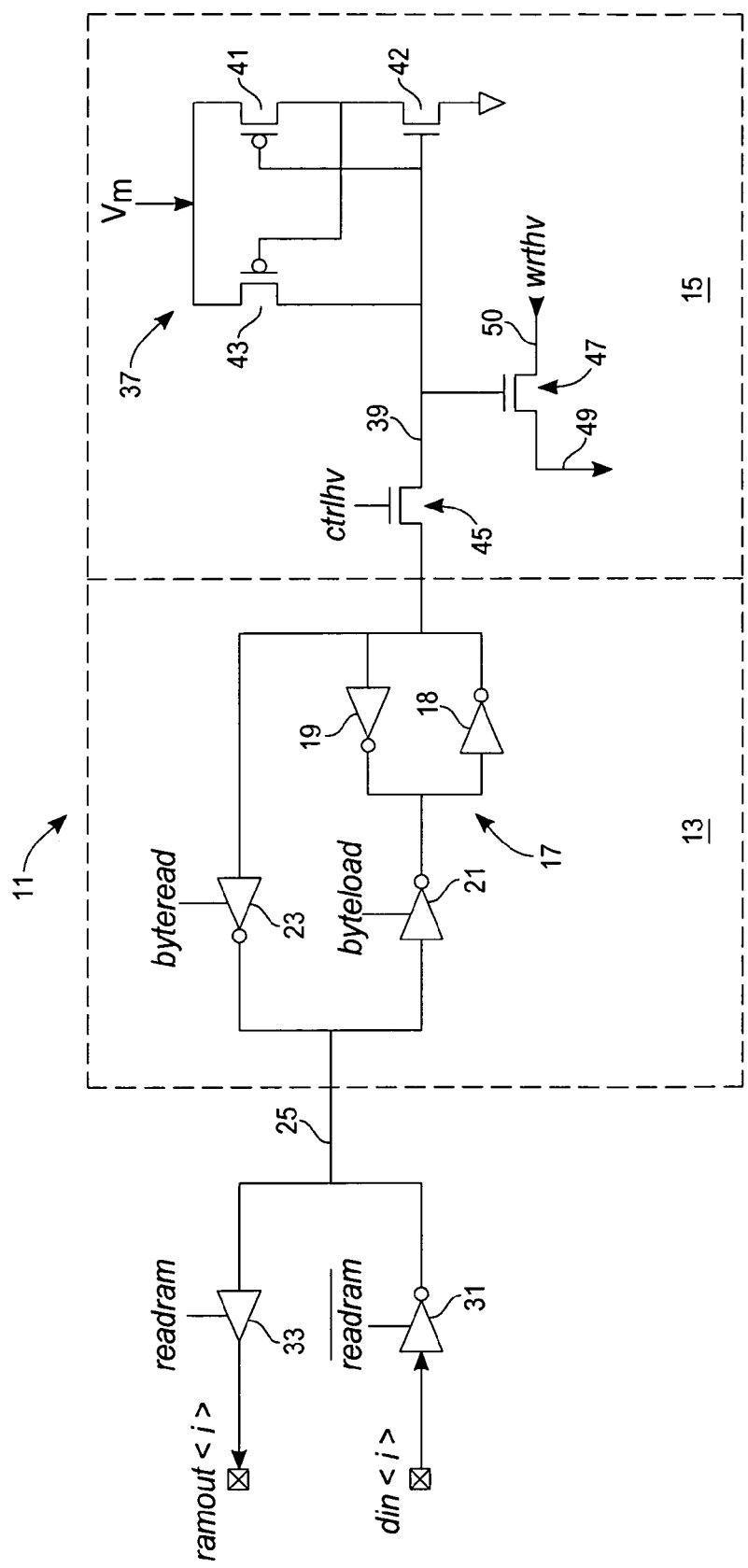
Fig._1

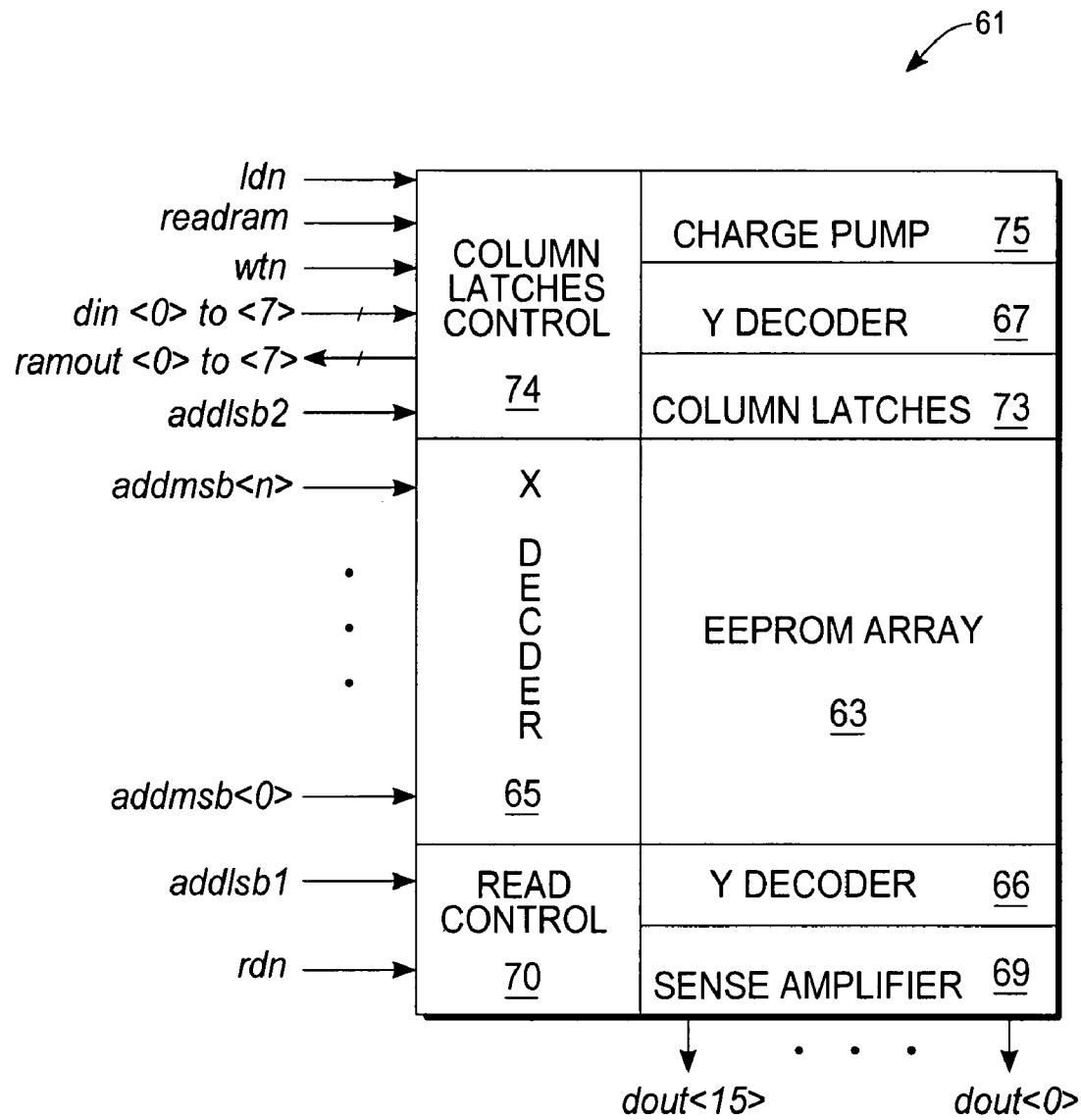
Fig._2

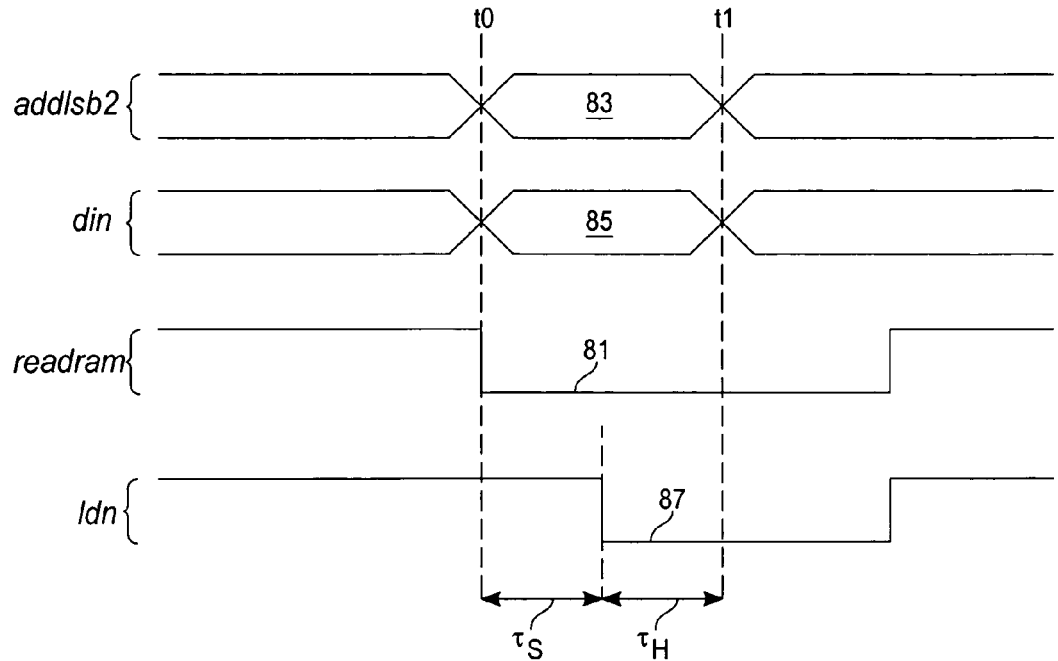
Fig._3A
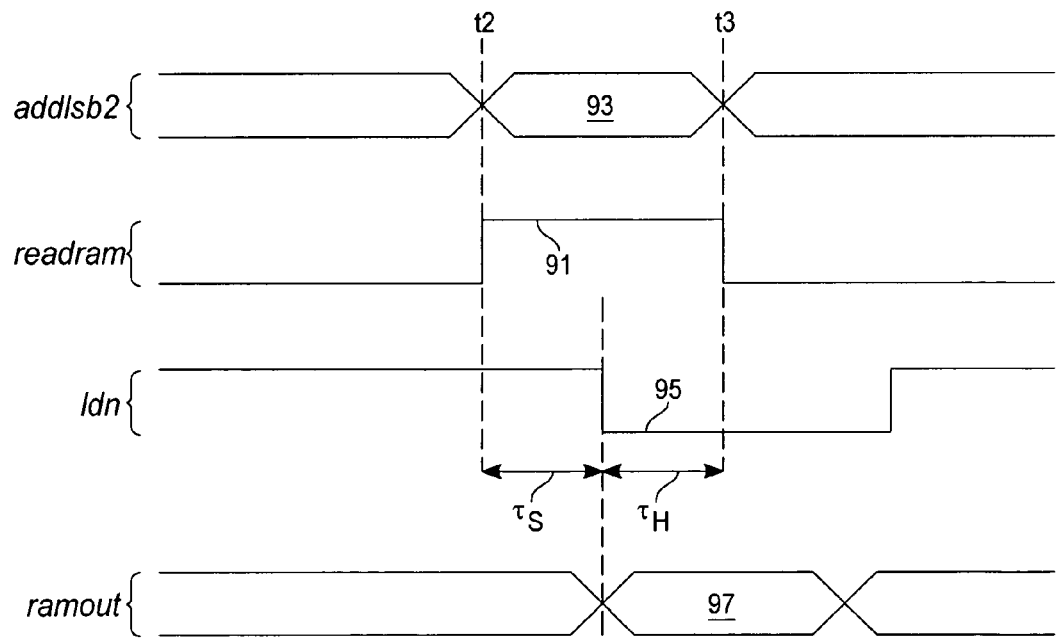
Fig._3B

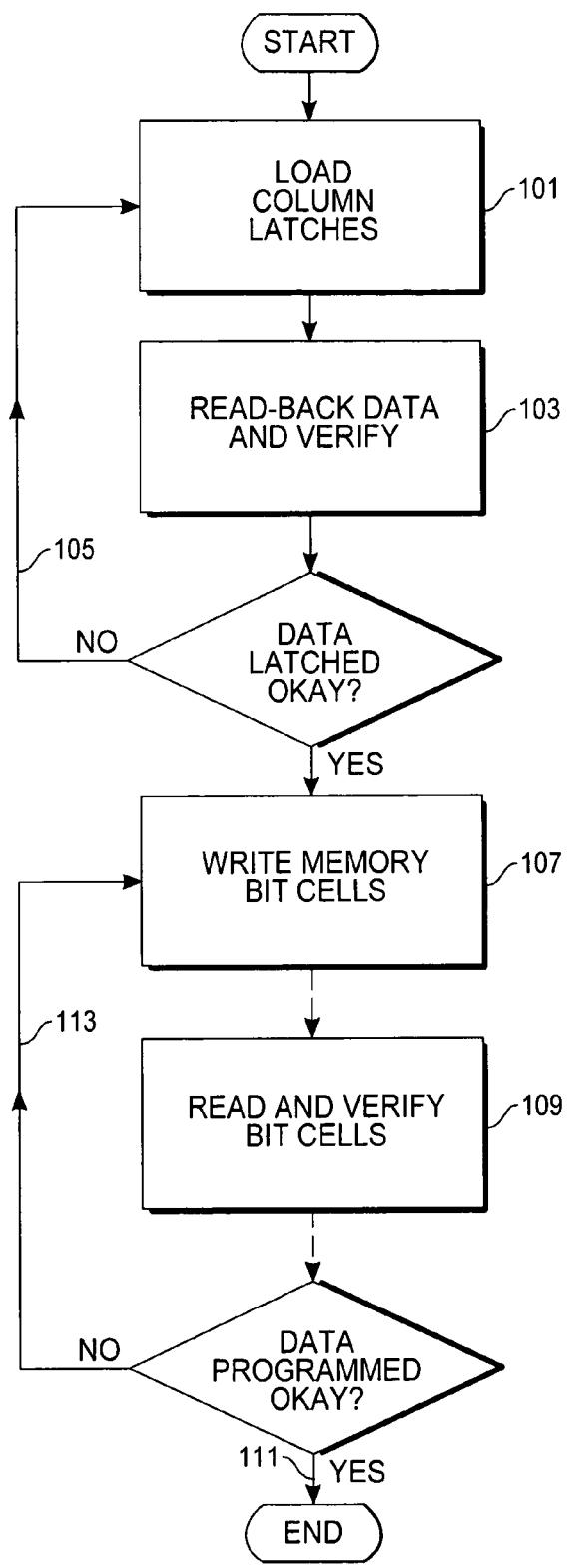
Fig._4

READ-ACCESSIBLE COLUMN LATCH FOR NON-VOLATILE MEMORIES

TECHNICAL FIELD

The present invention relates to data program column latch architectures for non-volatile floating-gate type memories, and also relates to verifying the writing of data from the column latches into floating-gate memory cells of such memories.

BACKGROUND ART

Memory storage capacities of embedded EEPROM memories used in smart card applications are being made ever larger to meet increasing memory requirements. One issue that arises with large memories is the ability to control the programming quality of the memories' bit cells, typically of the floating-gate type in EEPROMs. In existing systems, programming of an EEPROM has two phases. In a first 'load' phase, the data to be programmed are loaded from a RAM memory through a data input bus into column latch circuits of the EEPROM. Typically, the minimum data size that can be loaded is one byte and the maximum is a row or page of 64 or 128 bytes. In a second 'write' phase, the data stored in the column latches are transferred into addressed bit cells in the EEPROM memory array. The column latch circuits only serve to store the data while the programming of the bit cells is taking place. In order to verify the programming quality, the data is then read from the EEPROM's programmed bit cells and compared with the original data already stored in the RAM. If the data read out from the cells differs from the original data, programming of erroneous bytes is repeated until the correct data are verified.

A typical existing program column latch circuit has a low voltage portion and a high voltage portion. The low voltage portion is a simple latch (cross-coupled inverters) to which input data are written through a first transmission gate during the load phase of the programming operation. The high voltage portion is a level shifter supplied with the high voltage needed for programming. During the write phase of the programming operation, data stored in the low voltage latch are transferred into the high voltage portion through a second transmission gate that separates the low and high voltage portions. The level shifter pulls a '1' data value up to the programming voltage, while a '0' data value remains at 0V. The resulting voltage level in the level shifter controls a third transmission gate that drives one column of the memory cell array via a bit line. The voltage at the terminal opposite from the bit line is at the programming voltage for writing and at 0V for erasing. For verifying, the memory cells are read out through their normal read paths via sense amplifiers attached to the bit lines at the end opposite from the program column latches.

DISCLOSURE OF THE INVENTION

The present invention provides a column latch circuit for non-volatile memories that allows verification of the correct loading of the data to be programmed, without requiring any extra RAM memory. In particular, the new column latch now has a capability, not only to be accessed in a load mode to store data, but also to be accessed in a read-back mode to serve as a readable memory location for a verify comparisons.

In order to provide this read accessibility to the program column latches, the low voltage portion of the latch circuit is modified to allow bidirectional data flow into and out of the latch circuit. In particular, the first transmission gate on the former load path is now replaced with a pair of tri-state buffers that are controlled by respective load and read signals. The resulting circuit has both a load mode in which data is transferred into the latch through the load buffer, and a read-back mode in which latched data is read out through the read buffer.

The high voltage portion of the program column latch circuit is unchanged. Programming may be implemented in several phases: an initial load phase, a first (optional) read-back phase to verify proper latching of the data, a write phase in which the latched data are transferred via the high voltage portion of the column latch circuitry to the addressed bit cells of the memory array, and another read-back phase accompanies by a reading from the memory cells of the newly programmed data to verify proper programming of the data.

BRIEF DESCRIPTION OF THE DRAWINGS

FIG. 1 is a schematic circuit diagram of an exemplary program column latch circuit of the present invention.

FIG. 2 is a block schematic of non-volatile memory containing a plurality of program column latches like those in FIG. 1.

FIGS. 3A and 3B are timing diagrams for the respective load and read-back modes of the program column latch in FIG. 1.

FIG. 4 is a flow diagram illustrating a basic programming operation in accord with the present invention.

BEST MODE OF CARRYING OUT THE INVENTION

With reference to FIG. 1, a program column latch circuit 11 of the present invention for use in non-volatile memories has a low voltage portion 13 and a high voltage portion 15. A characteristic feature of the present invention is that the low voltage portion has a modified construction with respect to prior column latches that allows it to be accessed either in a load mode or a read-back mode.

The low voltage portion 13 comprises a latch 17 (cross-coupled inverters 18 and 19) that is accessed through a pair of opposite-facing tri-state buffers 21 and 23 that are controlled by respective load and read signals. Input data are written to the latch 17 through the load buffer 21 during a load phase. The stored contents of the latch 17 may be read out through the read buffer 23 during a read-back phase. In order to save area, there is only one input/output bus line 25 for both loading and reading the column latch. To avoid conflict, the load and read-back control signals may not both be high at the same time.

Additionally, outside the program column latch circuit 11, the non-volatile memory may include column latch control circuitry that, as one of its functions, selects a mode of all of the program column latches 11 in the memory, via an extra bit labeled readram. For example, when readram is low the load mode is selected, but when readram is high the read-back mode is selected; Pairs of opposite-facing tri-state buffers 31 and 33 on each of the data paths leading to external data pins of the memory may receive normal and inverted versions of readram. By "opposite-facing" we mean that the data flow through the tri-state buffers (input to output) are in opposite directions. That is, buffer 31 has its output leading into the column latch 11, while buffer 33 has its output coupled to the ramout terminal.

The high voltage portion 15 comprises a level shifter 37 that is supplied with the high voltage Vm needed for programming. Any of the level shifting circuits used for program column latches may be used here for level shifter 37. For example, the level shifter 37 may comprise an inverter of p-channel and n-channel transistors 41 and 42, whose common gate inputs are coupled to the line 39 and whose common drain outputs drive a p-channel pull-up transistor 43 whose source is coupled to the program voltage Vm and whose drain is also tied to the line 39. During a write phase, data stored in the low voltage latch 17 are transferred through a transmission gate 45 that separates the low and high voltage portions 13 and 15 onto a line 39 in the high voltage portion 15. The level shifter 37 pulls a '1' data value received onto line 39 up to the programming voltage Vm, while a received '0' data value remains at 0V. The resulting voltage level on the line 39 controls a second transmission gate 47 that drives one column of the memory cell array via a bit line 49. The voltage supply terminal 50 opposite from the bit line is at the programming voltage Vm for writing and at 0V for erasing.

With reference to FIG. 2, a non-volatile memory 61, such as an EEPROM, comprises an array 63 of bit cells together with supporting circuitry (address decoders, program latches, sense amplifiers, etc.) for accessing the contents stored in the bit cells. The address decoding circuitry may include an X decoder 65 receiving the more significant bits of an address (add_msb<n>) for selecting a row or page of the bit cells, and separate read and program Y decoders 66 and 67, each receiving one or more of the least significant bits of an address (add_lsb1 and add_lsb2), for selecting a specific byte of the bit cells.

Reading of the bit cells of the array 63 is implemented in a read mode (read control signal rdn=high) by sense amplifier array 69 in association with read control circuitry 70 and the read Y decoder 66. A byte of data is output from associated data terminals (Dout<15> to Dout<0>) of the memory 61.

Programming of the bit cells of the array 63 involves a combination of a load mode (load control signal ldn=high), followed by a latch verify or read-back mode (control signal readram=high) that is a characteristic feature of the present invention, and finally a write mode (write control signal wtn=high). This series of programming steps is implemented by a program column latch array 73 made up of a plurality of column latches like that seen in FIG. 1, in association with column latch control circuitry 74, charge pump circuitry 75 and the program Y decoder 67. Control inputs (wtn, ldn, and readram) interact with column latch control circuitry 74 to set a particular mode of the programming operation according to a particular phase in the programming sequence. Data to be programmed may be loaded in series through a data input terminal (Din) into the latch array 73 and also read-back out in series through another data terminal (ramout), or alternatively the memory could be constructed so that the data are loaded and read-back in parallel through sets of terminals (Din<0> to Din<7> and ramout <0> to ramout <7>) equivalent to those used for normal read operations. Since access times for the column latches 73 tend to be much shorter than the time needed the sense amplifiers 69 to read the non-volatile memory cells in the array 63, the number of column latch read-back terminals (ramout <0> to <7>) may be fewer than the data output terminals (dout <0> to <15>). Hence, a 16-bit memory cell read-out can be compared with the column latch contents in two sequential 8-bit readouts of the latch array.

The memory 61, shown in FIG. 2, and all of its component parts is basically conventional, except for the construction of the program column latches, shown in FIG. 1, and consequent provision of a read-back mode of programming operation that can be readily implemented with minor modifications in the latch control circuitry 74 in accord with the following discussion of the load and read-back modes with reference to the timing diagrams in FIGS. 3A and 3B.

FIG. 3A shows the column latch timing for a load phase of the programming operation. At a time t0, the signal readram controlling the tri-state buffers in the data path goes low (81) so that the direction of data flow is into the column latch circuits. At the same time, the program Y decoders receive (83) the least significant address bit addlsb2 that indicates a particular byte to be loaded. (The more significant bits for the X decoders are not needed until the write phase of the programming operation, but may be applied to the external address pins of the memory in any case.) Column latch control circuitry and the decoders generate a byteload signal (FIG. 1) for the particular byte of column latches. Accordingly, each column latch is selected by a byteload signal decoded from the addlsb2 bit and readram signal. Also at time t0, data bits din to be loaded into the latches are received (85). After a setup time $\tau_S$, the load control signal ldn goes low (87). Provided the address and data bits continue to be applied (83 and 85) for at least a hold time $\tau_H$ after the ldn has transitioned low, that is until a time t1, the data will be successfully loaded into the program column latches designated by the address. This completes the loading of the latches 17 in the low voltage portion 13 of each addressed column latch circuit 11 (FIG. 1). When column latches are not being accessed, then the load mode is selected by default to keep the bus line 25 data-driven by the buffer 31 and avoid a floating condition of the line 25.

FIG. 3B shows the column latch timing for a read-back phase of the programming operation, prior to transferring of the data to the high voltage portion 15 of the column latches 11 (FIG. 1). In FIG. 3B, at a time t2, the signal readram controlling the tri-state buffers in the data path goes high (91). The load tri-state buffer 31 is deactivated, while the read tri-state buffer 33 is activated. The direction of data flow is now out of the column latch circuits. At the same time, the program Y decoders receive (or continue to receive) (93) the least significant address bit addlsb2, indicating the particular byte of column latches to be read back. The column latch control circuitry and decoders generate a byteread signal (FIG. 1) for the particular byte of column latches, so that buffer 23 is active and buffer 21 is inactive. After a setup time $\tau_S$, the load control signal ldn goes low (95) and is held low for at least a hold time $\tau_H$, i.e., until time t3. Data bits latched in the low voltage portion of the addressed column latches are read out (97) through the ramout terminals, which may be the same as the data input terminals din used during the load phase.

If the read back indicates that one or more data bits were incorrectly latched, the load phase will be repeated and followed by another read back for load verification, until the correct data are latched or an error flag is generated by the system (e.g., in the case of damaged circuitry indicated by several unsuccessful attempts). If the read back verifies that the loaded data bits are correct, the program operation proceeds to the write phase, which may be identical to the prior art. Data are transferred from the low voltage portion into the high voltage portion as discussed above with reference to FIG. 1.

With reference to FIG. 4, an exemplary programming operation in accord with the present invention states with a load phase (101) in which addressed column latching circuits (17 in FIG. 1) are loaded with data bits from an external data path (din and 25 in FIG. 1). Next, the operation proceeds to a read-back phase (103) in which the latched data bits are read back from the latching circuits and verified by comparison with the original data that the bits have been correctly latched. If the verifying indicates incorrect latching of one or more bits then the operational flow returns (105) to the load phase for reloading of the latching circuits until the data bits have been verified as having been correctly latched. Once correct data latching has been verified, the operation proceeds to a write phase (107) in which the column latch circuits drive bit lines in accord with the latched data in order to write the data into addressed memory bit cells of the non-volatile memory. Once the writing phase is complete, the programming operation may then proceed to read and verify the programmed bit cells (109) by comparison with the data bits stored in the column latching circuits. If the data has been programmed correctly (111), the writing of this byte is complete. If read verify determines that the written data is incorrect (113), one option is to return to the write phase (107) for another attempt.

Because the load phase was verified prior to writing, this read verify step will encounter fewer write errors. Because the column latch circuits contain the data to be compared with the memory cell read-out for write verification, a separate RAM for this purpose is not required.

What is claimed is:

1. A read-accessible column latch circuit, comprising:
    a low voltage latching portion and a high voltage data writing portion coupled together through a first transmission gate, the first transmission gate configured to be responsive to a data transfer signal in a write mode;
    a first interface means coupling external input and output data paths to the low voltage latching portion, the first interface means configured to be responsive to load and read-back mode signals for selecting a data flow direction between the data paths and the low voltage latching portion and enabling data transfer through the interface means; and
    a second interface means for coupling the high voltage data writing portion to a bit line for a column of memory cells.

2. The column latch circuit as in claim 1 wherein the first interface means comprises a pair of opposite-facing tri-state buffers coupled to the low voltage latching portion and to the respective external input and output data paths, the tri-state buffers never both active simultaneously, one tri-state buffer configured to allow data flow in a load mode of a programming operation from the external input data path into the low voltage latching portion and the other tri-state buffer configured to allow data flow in a read-back mode of a programming operation from the low voltage latch portion to the external output data path, whereby latched data are read.

3. The column latch circuit as in claim 1 wherein the low voltage latching portion comprises a pair of cross-coupled inverters defining a latching circuit.

4. The column latch circuit as in claim 1 wherein the high voltage memory writing portion comprises a level-shifting circuit coupled to a programming voltage.

5. The column latch circuit as in claim 1 wherein the second interface means comprises a second transmission gate configured to be controlled by a voltage established by data transferred into the high voltage memory writing portion, the second transmission gate having conduction terminals coupling a programming/erase voltage source to the bit line.

6. A read-accessible column latch circuit for non-volatile memories, comprising:
    a pair of opposite-facing tri-state buffers coupled to external input and output data paths leading respectively to and from the column latch circuit and configured to select a data flow direction, the tri-state buffers never both active simultaneously;
    a latching circuit coupled to the tri-state buffers, the latching circuit configured to receive, from the external input data path, data to-be-loaded through one of the tri-state buffers in a load mode of a programming operation, and to read back latched data through the other of the tri-state buffers to the external output data path in a read-back mode of the programming operation;
    a first transmission gate coupled to the latching circuit the first transmission gate configured to allow transmission through the gate of latched data at the start of a write mode of the programming operation;
    a level-shifting circuit coupled to the transmission gate, the level-shifting circuit configured to shift a voltage corresponding to the data to a voltage needed for programming memory cells of the non-volatile memories in accord with the data; and
    a second transmission gate configured to couple the level-shifting circuit to a bit line leading to a column of non-volatile memory bit cells, such that data are written to selected bit cells in a write mode.

7. The column latch circuit as in claim 6 wherein the latching circuit comprises a pair of cross-coupled inverters.

8. The column latch circuit as in claim 6 wherein the tri-state buffers have control inputs configured to be responsive to a decoded byte address and to a flow direction control signal (readram).

9. The column latch circuit as in claim 6 wherein the level-shifting circuit comprises an inverter pair of transistors with an inverter input coupled to the first transmission gate and an inverter output coupled to a gate of a pull-up transistor, the pull-up transistor coupled to a programming voltage source and to the inverter input and the first transmission gate.

10. The column latch circuit as in claim 6 wherein the second transmission gate comprises a transistor with a control gate terminal coupled to the level-shifting circuit, and with source/drain conduction terminals coupling a voltage source to the bit line, the voltage source being a programming voltage for the programming operation.

11. A method of operating program column latch circuitry for programming a non-volatile memory, comprising:
    (a) loading addressed latching circuits of the program column latch circuitry with data bits from an external input data path;
    (b) writing the latched data bits to addressed memory cells of a non-volatile memory;
    (c) reading back latched data bits from the latching circuits to an external output data path and verifying whether the data bits in the addressed memory cells have been correctly written; and
    (d) if the verifying indicates incorrect writing, then repeating steps (b) and (c) until data bits have been verified as correctly written.

12. The method of claim 11 wherein the loading and reading back of data bits occurs as a transfer between the latching circuits and the respective external input and output data paths, a direction of data flow being controlled by a pair of opposite-facing tri-state buffers on the data paths in the program column latch circuitry, the tri-state buffers never both active simultaneously.

13. The method of claim 12 wherein the direction of flow is selected by an external control signal applied to the tri-state buffers.

14. The method of claim 13 wherein writing of data bits comprises transferring latched data bits through a transmission gate to level-shifting circuitry powered at a programming voltage and driving bit lines in accord with the transferred and level-shifted data.

15. The method of claim 11, further comprising:
prior to writing the latched data bits,
  (a1) reading back latched data bits from the latching circuits to the external output data path and verifying whether the to the external output data path and verifying whether the data bits have been correctly latched; and
  (a2) if the verifying indicates incorrect latching, then repeating steps (a) and (a1) until data bits have been verified as correctly latched.

* * * * *